(12) United States Patent
Lang et al.

(10) Patent No.: US 12,305,276 B2
(45) Date of Patent: May 20, 2025

(54) METHOD FOR PURGE CLEAN OF LOW PRESSURE FURNACE

(71) Applicant: Shanghai Huali Microelectronics Corporation, Shanghai (CN)

(72) Inventors: Yuhong Lang, Shanghai (CN); Xinxing Tu, Shanghai (CN)

(73) Assignee: Shanghai Huali Microelectronics Corporation (CN)

( * ) Notice: Subject to any disclaimer, the term of this patent is extended or adjusted under 35 U.S.C. 154(b) by 120 days.

(21) Appl. No.: 18/305,983

(22) Filed: Apr. 24, 2023

(65) Prior Publication Data

US 2023/0265557 A1 Aug. 24, 2023

(30) Foreign Application Priority Data

Oct. 31, 2022 (CN) .......................... 202211347068.8

(51) Int. Cl.
| | |
|---|---|
| *C23C 16/44* | (2006.01) |
| *B08B 5/00* | (2006.01) |
| *B08B 7/00* | (2006.01) |
| *B08B 7/04* | (2006.01) |
| *B08B 9/08* | (2006.01) |
| *F27B 17/00* | (2006.01) |
| *F27D 25/00* | (2010.01) |

(52) U.S. Cl.
CPC ............ *C23C 16/4405* (2013.01); *B08B 5/00* (2013.01); *B08B 7/0071* (2013.01); *B08B 7/04* (2013.01); *B08B 9/0804* (2013.01); *C23C 16/4408* (2013.01); *F27B 17/0025* (2013.01); *F27D 25/008* (2013.01); *B08B 2209/08* (2013.01)

(58) Field of Classification Search
CPC ............ C23C 16/4408; C23C 16/1105; B08B 2209/08; B08B 9/0804; B08B 7/04; B08B 7/0071; B08B 5/00
See application file for complete search history.

(56) References Cited

U.S. PATENT DOCUMENTS

| | | | |
|---|---|---|---|
| 2008/0014758 A1* | 1/2008 | Chou | ...................... C23C 16/452 438/761 |
| 2008/0245388 A1* | 10/2008 | Moriya | ............. H01L 21/67028 134/1 |

\* cited by examiner

Primary Examiner — Kelly M Gambetta
(74) Attorney, Agent, or Firm — Quarles & Brady LLP

(57) ABSTRACT

The present application discloses a method for purge clean of a low pressure furnace, comprising: step 1, providing a process chamber of the low pressure furnace in a standby state, wherein an inner wall thin film formed by a furnace deposition process is accumulated on the surface of an inner wall of the process chamber; step 2, performing temperature ramp-up or temperature ramp-down treatment on the process chamber to generate first thermal stress in the inner wall thin film, wherein thin film particles with poor adhesion in the inner wall thin film peels off; step 3, introducing a cleaning gas in a pulse manner to perform cycle purge clean on the process chamber, so as to remove the peeling thin film particles from the process chamber; and step 4, switching a state of the process chamber to the standby state after the cycle purge clean ends.

14 Claims, 4 Drawing Sheets

Step 1. A process chamber of a low pressure furnace in a standby state is provided, wherein an inner wall thin film formed by a furnace deposition process is accumulated on the surface of an inner wall of the process chamber Step 2. Temperature ramp-up or temperature ramp-down treatment is performed on the process chamber to generate first thermal stress in the inner wall thin film, wherein thin film particles with poor adhesion in the inner wall thin film peels off, and the first thermal stress is greater than second thermal stress formed in the inner wall thin film during the furnace deposition process Step 3. A cleaning gas is introduced in a pulse manner to perform cycle purge clean on the process chamber, so as to remove the peeling thin film particles from the process chamber Step 4. A state of the process chamber is switched to the standby state after the cycle purge clean ends

FIG. 4

METHOD FOR PURGE CLEAN OF LOW PRESSURE FURNACE

CROSS-REFERENCES TO RELATED APPLICATIONS

This application claims the priority to Chinese patent application No. CN 202211347068.8, filed on Oct. 31, 2022, and entitled "METHOD FOR PURGE CLEAN OF LOW PRESSURE FURNACE", the disclosure of which is incorporated herein by reference in entirety.

TECHNICAL FIELD

The present application relates to a method for manufacturing a semiconductor integrated circuit, in particular to a method for purge clean of a low pressure furnace.

BACKGROUND

In the furnace deposition process, a thin film is deposited on both a wafer and the inner wall of a process chamber of the furnace. The thin film on the inner wall is prone to peeling-off in the subsequent furnace deposition processes, separating from the inner wall to form peeling particles.

FIG. 1 is a schematic diagram of a structure of a process chamber in which a peeling particle defect is formed during an existing low pressure furnace deposition process. The material of the inner wall 101 of the process chamber is quartz, and FIG. 1 shows only a sectional structure of the process chamber. In the overall structure, the inner wall 101 forms a circular tube structure.

The process chamber presents a vertical tubular structure. During the furnace deposition process, each wafer 103 is placed in a boat 102 and moved into the process chamber by means of the boat 102.

As the furnace deposition process progresses, an inner wall thin film 104 formed by the furnace deposition process is accumulated on the surface of the inner wall 101 of the process chamber.

During the furnace deposition process, thin film particles 105 with poor adhesion in the inner wall thin film 104 is prone to peeling-off and deposited on the surface of the wafer 103, thereby contaminating the wafer 103. FIG. 2 is a photo of the peeling particle defect formed during the existing low pressure furnace deposition process. The peeling particle in FIG. 2 is individually represented with a mark 105a.

In order to prevent contamination produced by the thin film particles 105, periodical purge clean of the low pressure furnace is required.

An existing method for purge clean of a low pressure furnace is to continuously introduce a cleaning gas under a high-temperature condition to purify a gas pipeline and the furnace. FIG. 3 illustrates curves of temperature and cleaning gas flow rate of the existing method for purge clean of a low pressure furnace. Curve 201 is a temperature curve, from which it can be seen that the temperature is maintained at a high temperature during the purge clean; and curve 202 is a cleaning gas flow rate curve, from which it can be seen that the cleaning gas flow rate is constant. The cleaning gas is typically nitrogen, i.e., N2, so the purge clean is also referred to as N2 purge.

An advantage of the existing method is: N2 purge with a high flow rate can clean off residual particles in the furnace chamber.

A disadvantage is: the particle improvement capability is limited, so effective separation of particles with poor adhesion from the inner wall of the furnace cannot be achieved. In this case, the particles with poor adhesion are still prone to peeling-off in the subsequent furnace deposition processes.

BRIEF SUMMARY

According to some embodiments in this application, a method for purge clean of a low pressure furnace is disclosed in the following steps:
step 1, providing a process chamber of the low pressure furnace in a standby state, wherein an inner wall thin film formed by a furnace deposition process is accumulated on the surface of an inner wall of the process chamber;
step 2, performing temperature ramp-up or temperature ramp-down treatment on the process chamber to generate first thermal stress in the inner wall thin film, wherein a thin film particles with poor adhesion in the inner wall thin film peels off due to release of the first thermal stress, the thin film particles with poor adhesion refer to thin film particles that will peel off during the subsequent furnace deposition process thin film particles, and the first thermal stress is greater than second thermal stress formed in the inner wall thin film during the furnace deposition process;
step 3, introducing a cleaning gas in a pulse manner to perform cycle purge clean on the process chamber, so as to remove the peeling thin film particles from the process chamber; and
step 4, switching a state of the process chamber to the standby state after the cycle purge clean ends.

In some cases, the process chamber in step 1 undergoes the furnace deposition process more than one time.

In some cases, the material of the inner wall of the process chamber in step 1 is quartz.

In some cases, the process chamber presents a vertical tubular structure.

In some cases, step 2 includes the following substeps:
step 21, performing the first temperature ramp-up treatment on the process chamber, wherein the first temperature ramp-up treatment ramps up the temperature of the process chamber from a standby temperature to a first temperature at a first temperature ramp-up rate, and during the first temperature ramp-up treatment, the first thermal stress is temperature ramp-up thermal stress and the first thermal stress becomes larger when the first temperature ramp-up rate becomes larger;
step 22, performing high-temperature thermostatic treatment on the process chamber at the first temperature;
step 23, performing the temperature ramp-down treatment on the process chamber, wherein the temperature ramp-down treatment ramps down the temperature of the process chamber from the first temperature to a second temperature at a second temperature ramp-down rate, the second temperature is less than the standby temperature, and during the temperature ramp-down treatment, the first thermal stress is temperature ramp-down thermal stress and the first thermal stress becomes larger when the second temperature ramp-down rate becomes larger;
step 24, performing low-temperature thermostatic treatment on the process chamber at the second temperature; and step 25, performing the second temperature ramp-up treatment on the process chamber, wherein the second temperature ramp-up treatment ramps up the temperature of the process chamber from the second temperature to the standby temperature at a second temperature ramp-up rate, and during the second temperature ramp-up treatment, the first thermal stress is temperature ramp-up thermal stress and the first thermal stress becomes larger when the second temperature ramp-up rate becomes larger.

In some cases, the cycle purge clean in step 3 starts when step 22 starts and ends when step 25 ends.

In some cases, after step 25, the method further includes: performing third thermostatic treatment on the process chamber at the standby temperature, wherein during the third thermostatic treatment, the cycle purge clean is maintained in step 3, and when step 3 ends, the third thermostatic treatment ends and step 4 starts.

In some cases, the first temperature in step 21 is determined by a process temperature of the furnace deposition process.

In some cases, a time of the high-temperature thermostatic treatment in step 22 is 10-40 minutes.

In some cases, in step 3, the cleaning gas includes nitrogen, the cleaning gas is introduced with a pulse time of 2-5 minutes and an interval time of 2-5 minutes, and the cleaning gas is introduced at a gas flow rate of 30-500 sccm.

In some cases, a time of the low-temperature thermostatic treatment in step 24 is 10-40 minutes.

In some cases, the process chamber simultaneously grows thin films on a plurality of wafers during the furnace deposition process.

In some cases, each of the wafers is placed in a boat.

In some cases, a thin film material deposited by the furnace deposition process includes polysilicon, silicon dioxide, or silicon nitride.

In some cases, after step 4, the process chamber is on standby for the furnace deposition process of a next batch of the wafers.

Different from an existing process where purge clean is performed under a high-temperature thermostatic condition by using a cleaning gas with a constant flow rate, the present application performs violent temperature ramp-up treatment or temperature ramp-down treatment on the process chamber. When a temperature change during the temperature ramp-up treatment or temperature ramp-down treatment becomes more violent, i.e., when a temperature change rate becomes larger, the first thermal stress applied to the inner wall thin film becomes larger. In view of the feature, by increasing the magnitude of the first thermal stress to be greater than that of the second thermal stress formed in the inner wall thin film during the furnace deposition process, the first thermal stress can peel off all the thin film particles with poor adhesion that are prone to peeling-off during the furnace deposition process. Subsequently, under the impact effect of the cycle purge clean, all the peeling thin film particles can be removed from the process chamber. Therefore, the present application can peel off all the thin film particles with poor adhesion in the inner wall thin film which are accumulated inside the process chamber, thereby avoiding the risk of peeling-off of the thin film particles with poor adhesion in the subsequent furnace deposition process, and ultimately improving the product yield.

BRIEF DESCRIPTION OF THE DRAWINGS

The present application will be further described in detail below with reference to the drawings and specific implementations:

FIG. 4 is a flowchart of a method for purge clean of a low pressure furnace according to an embodiment of the present application.

DETAILED DESCRIPTION OF THE DISCLOSURE

Figure 5:
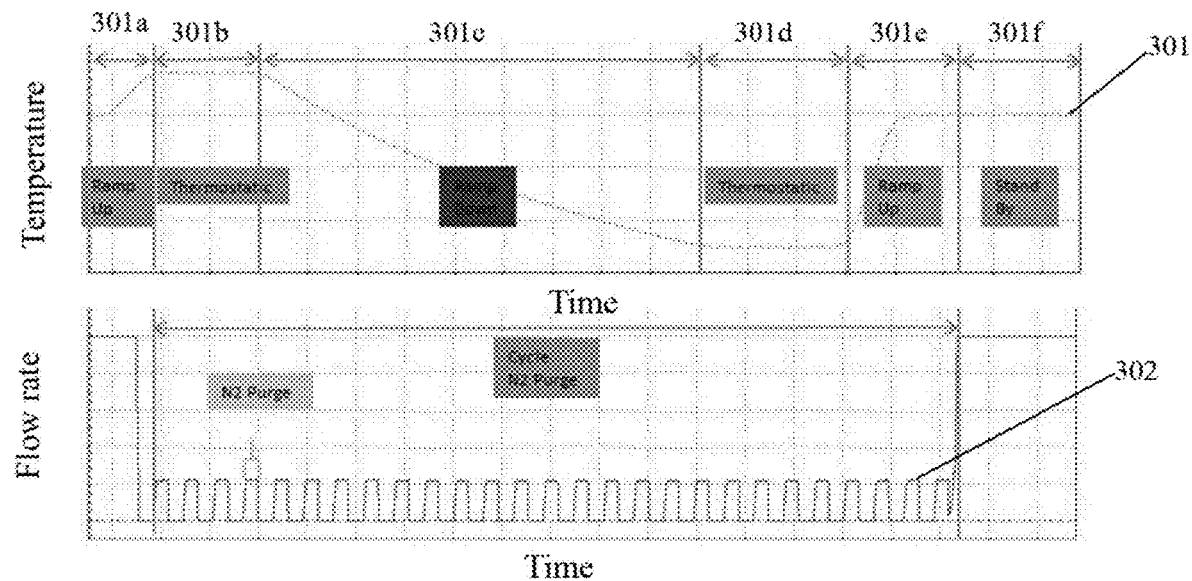
FIG. 5 illustrates curves of temperature and cleaning gas flow rate of the method for purge clean of a low pressure furnace according to an embodiment of the present application.

FIG. 4 is a flowchart of a method for purge clean of a low pressure furnace according to an embodiment of the present application. FIG. 5 illustrates curves of temperature and cleaning gas flow rate of the method for purge clean of a low pressure furnace according to an embodiment of the present application. The method for purge clean of a low pressure furnace according to this embodiment of the present application includes the following steps.

Step 1. A process chamber of the low pressure furnace in a standby state is provided.

Figure 1:
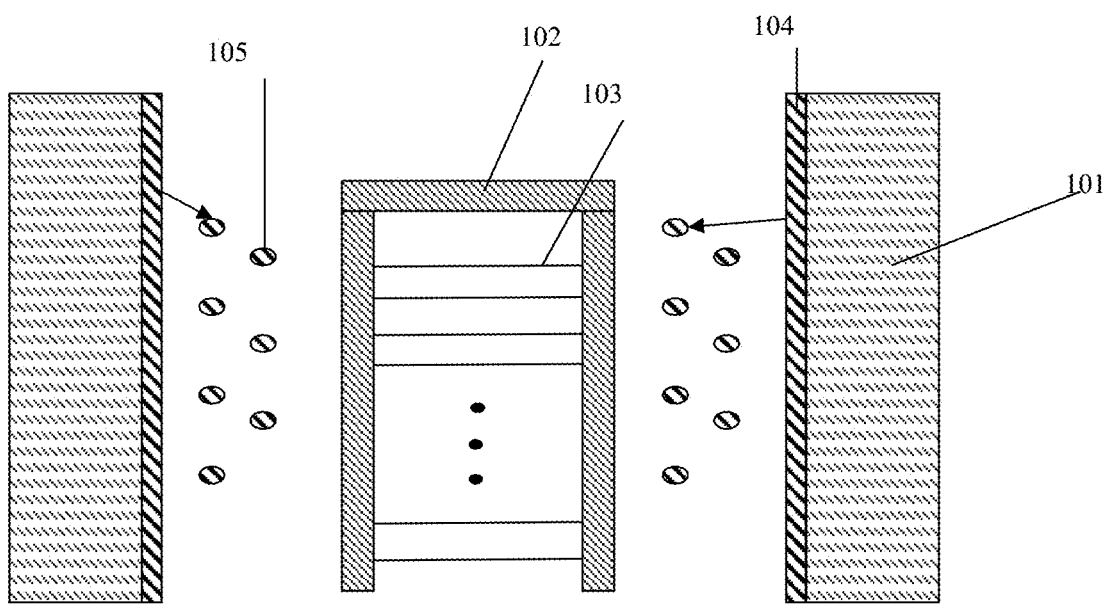
FIG. 1 is a schematic diagram of a structure of a process chamber in which a peeling particle defect is formed during an existing low pressure furnace deposition process.
Figure 2:
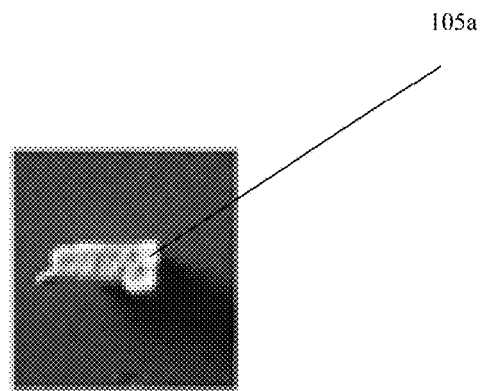
FIG. 2 is a photo of the peeling particle defect formed during the existing low pressure furnace deposition process.
Figure 3:
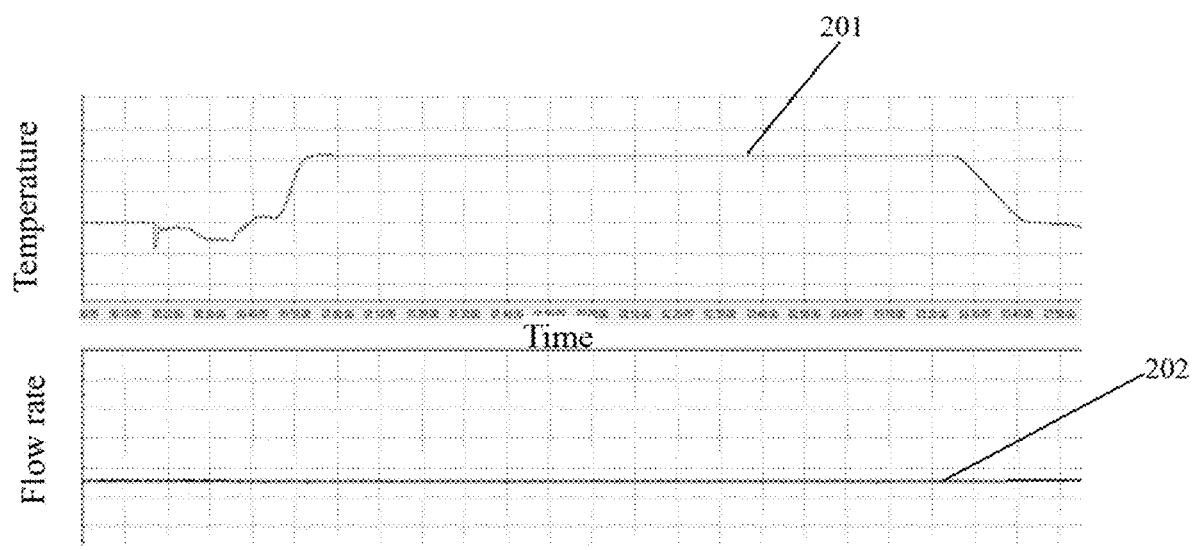
FIG. 3 illustrates curves of temperature and cleaning gas flow rate of an existing method for purge clean of a low pressure furnace.

For a structure of the process chamber, reference may be made to FIG. 1. Referring to FIG. 1, an inner wall thin film 104 formed by a furnace deposition process is accumulated on the surface of an inner wall 101 of the process chamber.

In this embodiment of the present application, the material of the inner wall 101 of the process chamber is quartz.

The process chamber presents a vertical tubular structure.

The process chamber simultaneously grows thin films on a plurality of wafers 103 during the furnace deposition process.

Each of the wafers 103 is placed in a boat 102.

A thin film material deposited by the furnace deposition process includes polysilicon, silicon dioxide, or silicon nitride.

The process chamber in step 1 undergoes the furnace deposition process more than one time, such that a relatively large number of the thin film particles prone to peeling-off are accumulated in the inner wall thin film 104.

Step 2. Temperature ramp-up or temperature ramp-down treatment is performed on the process chamber to generate first thermal stress in the inner wall thin film 104, wherein a thin film particles with poor adhesion in the inner wall thin film 104 peels off due to release of the first thermal stress, the thin film particles with poor adhesion refer to thin film particles that will peel off during the subsequent furnace deposition process thin film particles, and the first thermal stress is greater than second thermal stress formed in the inner wall thin film 104 during the furnace deposition process.

In this embodiment of the present application, referring to FIG. 5, step 2 includes the following substeps.

Step 21. The first temperature ramp-up treatment is performed on the process chamber, wherein the first temperature ramp-up treatment ramps up the temperature of the process chamber from a standby temperature to a first temperature at a first temperature ramp-up rate, and during the first temperature ramp-up treatment, the first thermal stress is temperature ramp-up thermal stress and the first thermal stress becomes larger when the first temperature ramp-up rate becomes larger.

In FIG. 5, the first temperature ramp-up treatment is a stage corresponding to the mark 301a. It can be seen that the temperature curve 301 rapidly rises at the stage 301a. The first temperature ramp-up treatment is also represented by Ramp Up in FIG. 5.

In some embodiments, the first temperature is determined by a process temperature of the furnace deposition process.

Step 22. High-temperature thermostatic treatment is performed on the process chamber at the first temperature.

In FIG. 5, the high-temperature thermostatic treatment is a stage corresponding to the mark 301b. It can be seen that the temperature curve 301 remains constant at the stage 301b. The high-temperature thermostatic is also represented by Thermostatic in FIG. 5.

In some embodiments, a time of the high-temperature thermostatic treatment in step 22 is 10-40 minutes.

Step 23. The temperature ramp-down treatment is performed on the process chamber, wherein the temperature ramp-down treatment ramps down the temperature of the process chamber from the first temperature to a second temperature at a second temperature ramp-down rate, the second temperature is less than the standby temperature, and during the temperature ramp-down treatment, the first thermal stress is temperature ramp-down thermal stress and the first thermal stress becomes larger when the second temperature ramp-down rate becomes larger.

In FIG. 5, the temperature ramp-down treatment is a stage corresponding to the mark 301c. It can be seen that the temperature curve 301 rapidly drops at the stage 301c. The temperature ramp-down treatment is also represented by Ramp Down in FIG. 5.

Step 24. Low-temperature thermostatic treatment is performed on the process chamber at the second temperature.

In FIG. 5, the low-temperature thermostatic treatment is a stage corresponding to the mark 301d. It can be seen that the temperature curve 301 remains constant at the stage 301d. The low-temperature thermostatic is also represented by Thermostatic in FIG. 5.

In some embodiments, a time of the low-temperature thermostatic treatment is 10-40 minutes.

Step 25. The second temperature ramp-up treatment is performed on the process chamber, wherein the second temperature ramp-up treatment ramps up the temperature of the process chamber from the second temperature to the standby temperature at a second temperature ramp-up rate, and during the second temperature ramp-up treatment, the first thermal stress is temperature ramp-up thermal stress and the first thermal stress becomes larger when the second temperature ramp-up rate becomes larger.

In FIG. 5, the second temperature ramp-up treatment is a stage corresponding to the mark 301e. It can be seen that the temperature curve 301 rapidly rises at the stage 301e. The second temperature ramp-up treatment is also represented by Ramp Up in FIG. 5.

Step 3. A cleaning gas is introduced in a pulse manner to perform cycle purge clean on the process chamber, so as to remove the peeling thin film particles from the process chamber.

In this embodiment of the present application, the cycle purge clean in step 3 starts when step 22 starts and ends when step 25 ends.

In step 3, the cleaning gas includes nitrogen, the cleaning gas is introduced with a pulse time of 2-5 minutes and an interval time of 2-5 minutes, and the cleaning gas is introduced at a gas flow rate of 30-500 sccm. In FIG. 5, in the cleaning gas flow rate curve 302, the cycle purge clean is also represented by Cycle N2 purge, and represented by N2 purge at each pulse.

In some embodiments, after step 25, the method further includes: performing third thermostatic treatment on the process chamber at the standby temperature, wherein during the third thermostatic treatment, the cycle purge clean is maintained in step 3, and when step 3 ends, the third thermostatic treatment ends and step 4 starts. In FIG. 5, the third thermostatic treatment is also in stage 301e.

Step 4. A state of the process chamber is switched to the standby state after the cycle purge clean ends.

In FIG. 5, the standby state after the cycle purge clean is in a stage corresponding to the mark 301f, and the standby state is also represented by standby.

After step 4, the process chamber is on standby for the furnace deposition process of a next batch of the wafers 103. Since no thin film particles with poor adhesion exists in the process chamber after step 4 of this embodiment of the present application, the number of peeling particle defects can be significantly reduced in the subsequent furnace deposition process.

Different from an existing process where purge clean is performed under a high-temperature thermostatic condition by using a cleaning gas with a constant flow rate, this embodiment of the present application performs violent temperature ramp-up treatment or temperature ramp-down treatment on the process chamber. When a temperature change during the temperature ramp-up treatment or temperature ramp-down treatment becomes more violent, i.e., when a temperature change rate becomes larger, the first thermal stress applied to the inner wall thin film 104 becomes larger. In view of the feature, by increasing the magnitude of the first thermal stress to be greater than that of the second thermal stress formed in the inner wall thin film 104 during the furnace deposition process, the first thermal stress can peel off all the thin film particles with poor adhesion that are prone to peeling-off during the furnace deposition process. Subsequently, under the impact effect of the cycle purge clean, all the peeling thin film particles can be removed from the process chamber. Therefore, this embodiment of the present application can peel off all the thin film particles with poor adhesion in the inner wall thin film 104 which are accumulated inside the process chamber, thereby avoiding the risk of peeling-off of the thin film particles with poor adhesion in the subsequent furnace deposition process, and ultimately improving the product yield.

This embodiment of the present application violently ramps up or ramps down the temperature of the furnace chamber by means of the thermal stress principle, releasing the thin film stress accumulated on the furnace wall in the chamber and causing peeling-off of the thin film particles with poor adhesion from the furnace wall, and introducing the cleaning gas at intervals to effectively clean the furnace chamber, reducing the peeling particles of the inner wall of the furnace during the process. Therefore, this embodiment of the present application can more effectively peel off particles with poor adhesion on the inner wall of the furnace. Thermal stress is stress generated because the thin film cannot fully expand and contract freely when temperature changes due to internal and external constraints.

Figure 6:
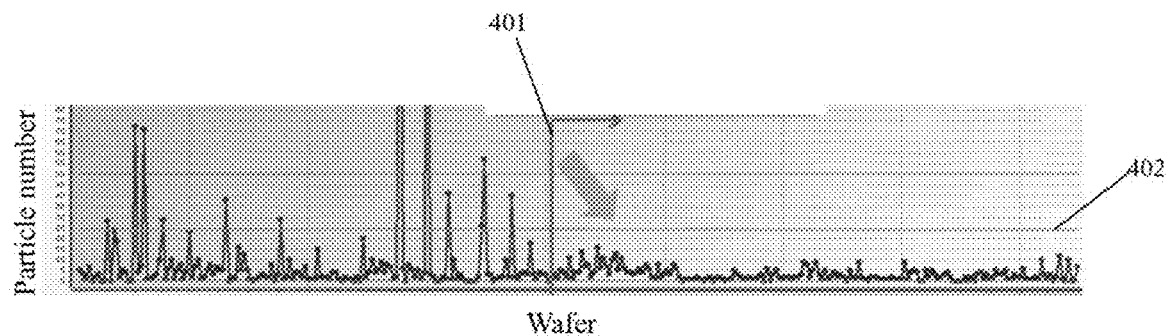
FIG. 6 illustrates statistical curves of the numbers of peeling particle defects formed on a wafer during a furnace deposition process after the existing method for purge clean of a low pressure furnace is implemented and after the method for purge clean of a low pressure furnace according to an embodiment of the present application is implemented.

This embodiment of the present application can effectively reduce the peeling particles on a product by means of violent temperature ramp-up or ramp-down and cycle purge clean using the cleaning gas. In the long run, the peeling particles on the product are reduced by 10 particles, accounting for 33% of the original peeling particles. FIG. 6 illustrates statistical curves of the numbers of peeling particle defects formed on the wafer 103 during the furnace deposition process after the existing method for purge clean of a low pressure furnace is implemented and after the method for purge clean of a low pressure furnace according to this embodiment of the present application is implemented. The curve on the left side of the arrow line 401 is the statistical curve of the number of peeling particle defects formed on the wafer 103 during the furnace deposition process after the existing method for purge clean of a low pressure furnace is implemented. The curve on the right side of the arrow line 401, which is the direction indicated by the arrow, is the statistical curve of the number of peeling particle defects formed on the wafer 103 during the furnace deposition process after the existing method for purge clean of a low pressure furnace is implemented. It can be seen that, after the method of this embodiment of the present application is implemented, the number of peeling particle defects is maintained below a specification (spec) line 402.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for purge clean of a low pressure furnace, comprising the following steps:
   step 1, providing a process chamber of the low pressure furnace in a standby state, wherein an inner wall thin film formed by a furnace deposition process is accumulated on the surface of an inner wall of the process chamber;
   step 2, performing temperature ramp-up and/or temperature ramp-down treatment on the process chamber to generate first thermal stress in the inner wall thin film, wherein thin film particles with poor adhesion in the inner wall thin film peels off due to release of the first thermal stress, the thin film particles with poor adhesion refer to thin film particles that will peel off during the subsequent furnace deposition process thin film particles, and the first thermal stress is greater than second thermal stress formed in the inner wall thin film during the furnace deposition process;
   wherein step 2 comprises the following substeps:
   step 21, performing the first temperature ramp-up treatment on the process chamber, wherein the first temperature ramp-up treatment ramps up the temperature of the process chamber from a standby temperature to a first temperature at a first temperature ramp-up rate, and during the first temperature ramp-up treatment, the first thermal stress is temperature ramp-up thermal stress and the first thermal stress becomes larger when the first temperature ramp-up rate becomes larger;
   step 22, performing high-temperature thermostatic treatment on the process chamber at the first temperature;
   step 23, performing the temperature ramp-down treatment on the process chamber, wherein the temperature ramp-down treatment ramps down the temperature of the process chamber from the first temperature to a second temperature at a second temperature ramp-down rate, the second temperature is less than the standby temperature, and during the temperature ramp-down treatment, the first thermal stress is temperature ramp-down thermal stress and the first thermal stress becomes larger when the second temperature ramp-down rate becomes larger;
   step 24, performing low-temperature thermostatic treatment on the process chamber at the second temperature; and
   step 25, performing the second temperature ramp-up treatment on the process chamber, wherein the second temperature ramp-up treatment ramps up the temperature of the process chamber from the second temperature to the standby temperature at a second temperature ramp-up rate, and during the second temperature ramp-up treatment, the first thermal stress is temperature ramp-up thermal stress and the first thermal stress becomes larger when the second temperature ramp-up rate becomes larger;
   step 3, introducing a cleaning gas in a pulse manner to perform cycle purge clean on the process chamber, so as to remove the peeling thin film particles from the process chamber; and
   step 4, switching a state of the process chamber to the standby state after the cycle purge clean ends.

2. The method for purge clean of a low pressure furnace according to claim 1, wherein the process chamber in step 1 undergoes the furnace deposition process more than one time.

3. The method for purge clean of a low pressure furnace according to claim 1, wherein the material of the inner wall of the process chamber in step 1 is quartz.

4. The method for purge clean of a low pressure furnace according to claim 3, wherein the process chamber presents a vertical tubular structure.

5. The method for purge clean of a low pressure furnace according to claim 1, wherein the cycle purge clean in step 3 starts when step 22 starts and ends when step 25 ends.

6. The method for purge clean of a low pressure furnace according to claim 5, after step 25, further comprising: performing third thermostatic treatment on the process chamber at the standby temperature, wherein during the third thermostatic treatment, the cycle purge clean is maintained in step 3, and when step 3 ends, the third thermostatic treatment ends and step 4 starts.

7. The method for purge clean of a low pressure furnace according to claim 5, wherein the first temperature in step 21 is determined by a process temperature of the furnace deposition process.

8. The method for purge clean of a low pressure furnace according to claim 5, wherein a time of the high-temperature thermostatic treatment in step 22 is 10-40 minutes.

9. The method for purge clean of a low pressure furnace according to claim 5, wherein in step 3, the cleaning gas comprises nitrogen, the cleaning gas is introduced with a pulse time of 2-5 minutes and an interval time of 2-5 minutes, and the cleaning gas is introduced at a gas flow rate of 30-500 sccm.

10. The method for purge clean of a low pressure furnace according to claim 5, wherein a time of the low-temperature thermostatic treatment in step 24 is 10-40 minutes.

11. The method for purge clean of a low pressure furnace according to claim 4, wherein the process chamber simultaneously grows thin films on a plurality of wafers during the furnace deposition process.

12. The method for purge clean of a low pressure furnace according to claim 11, wherein each of the wafers is placed in a boat.

13. The method for purge clean of a low pressure furnace according to claim 11, wherein a thin film material deposited by the furnace deposition process comprises polysilicon, silicon dioxide, or silicon nitride.

14. The method for purge clean of a low pressure furnace according to claim 1, wherein after step 4, the process chamber is on standby for the furnace deposition process of a next batch of the wafers.

\* \* \* \* \*